United States Patent
Son et al.

(10) Patent No.: US 9,984,733 B2
(45) Date of Patent: May 29, 2018

(54) POWER CONTROL DEVICE AND SEMICONDUCTOR MEMORY DEVICE INCLUDING THE SAME

(71) Applicant: SK hynix Inc., Icheon-si, Gyeonggi-do (KR)

(72) Inventors: Jong Ho Son, Icheon-si (KR); Jae Wook Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/493,508

(22) Filed: Apr. 21, 2017

(65) Prior Publication Data

US 2018/0122436 A1    May 3, 2018

(30) Foreign Application Priority Data

Oct. 31, 2016  (KR) ........................ 10 2016 0143069

(51) Int. Cl.
| G11C 7/00 | (2006.01) |
| G11C 7/12 | (2006.01) |
| G11C 7/06 | (2006.01) |
| G11C 5/14 | (2006.01) |

(52) U.S. Cl.
CPC ............... *G11C 7/12* (2013.01); *G11C 5/148* (2013.01); *G11C 7/065* (2013.01)

(58) Field of Classification Search
CPC ............ G11C 7/12; G11C 5/148; G11C 7/065
USPC ..................................... 365/185.11
See application file for complete search history.

(56) References Cited

U.S. PATENT DOCUMENTS

| 7,706,192 B2 | 4/2010 | Min et al. |
| 9,236,859 B1 | 1/2016 | Hong |
| 9,461,648 B1* | 10/2016 | Lee .................. H03K 19/00315 |

\* cited by examiner

*Primary Examiner* — Huan Hoang
(74) *Attorney, Agent, or Firm* — William Park & Associates Ltd.

(57) ABSTRACT

A power control device and a semiconductor memory device including the same may be provided. The power control device, may include an amplifier configured to amplify an input signal having a second power-supply voltage level to a first power-supply voltage level having a voltage level different from the second power-supply voltage level. The power control device may include an output portion configured to set an output signal of the amplifier to a specific logic level upon receiving a control signal, and output the output signal having the specific logic level.

20 Claims, 10 Drawing Sheets

POWER CONTROL DEVICE AND SEMICONDUCTOR MEMORY DEVICE INCLUDING THE SAME

CROSS-REFERENCE TO RELATED APPLICATION

This application claims priority based upon Korean patent application No. 10-2016-0143069, filed on Oct. 31, 2016, the disclosure of which is hereby incorporated in its entirety by reference herein.

BACKGROUND

1. Technical Field

Embodiments of the present disclosure may generally relate to a power control device and a semiconductor memory device including the same, and more particularly to a technology relating to the stabilization of an output power when power of a power control device having heterogeneous power is ramped up.

2. Related Art

Generally, between two blocks configured to use different drive voltages a semiconductor device uses a level shifter during signal shifting between the two blocks. That is, a swing level of an input signal may be different from a swing level of an output signal.

The level shifter changes a swing voltage level of the input signal, and outputs the changed swing voltage level. Although the level shifter can also reduce the swing voltage level of the input signal, the level shifter has been widely used in cases where the voltage level of the input signal is boosted and output.

The level shifter uses heterogeneous power having different voltage levels, i.e., a first power-supply voltage VDD1 and a second power-supply voltage VDD2. However, undesired leakage current may occur before the first power-supply voltage VDD1 and the second power-supply voltage VDD2 are ramped up. That is, assuming that a time point at which the first power-supply voltage VDD1 is ramped up and set is different from a time point at which the second power-supply voltage VDD2 is ramped up and set, an unnecessary leakage current may occur such that an output voltage level may be abnormal.

SUMMARY

In accordance with an embodiment of the present disclosure, a power control device may be provided. The power control device may include an amplifier configured to amplify an input signal having a second power-supply voltage level to a first power-supply voltage level having a voltage level different from the second power-supply voltage level. The power control device may include an output portion configured to set an output signal of the amplifier to a specific logic level upon receiving a control signal, and output the output signal having the specific logic level.

In accordance with an embodiment of the present disclosure, a semiconductor memory device may be provided. The semiconductor memory device may include a power control device.

DETAILED DESCRIPTION

Reference will now be made to embodiments of the present disclosure, examples of which are illustrated in the accompanying drawings. Wherever possible, the same reference numbers are used throughout the drawings to refer to the same or like portions. In the following description of the present disclosure, a description of related known configurations or functions incorporated herein may be omitted for clarity of the subject matter of the present disclosure.

Various embodiments of the present disclosure MAY BE directed to providing a power control device and a semiconductor memory device including the same that substantially obviate one or more problems due to limitations and disadvantages of the related art.

An embodiment of the present disclosure may relate to a technology for stabilizing output power when power of a power control device having heterogeneous power is ramped up.

Figure 1:
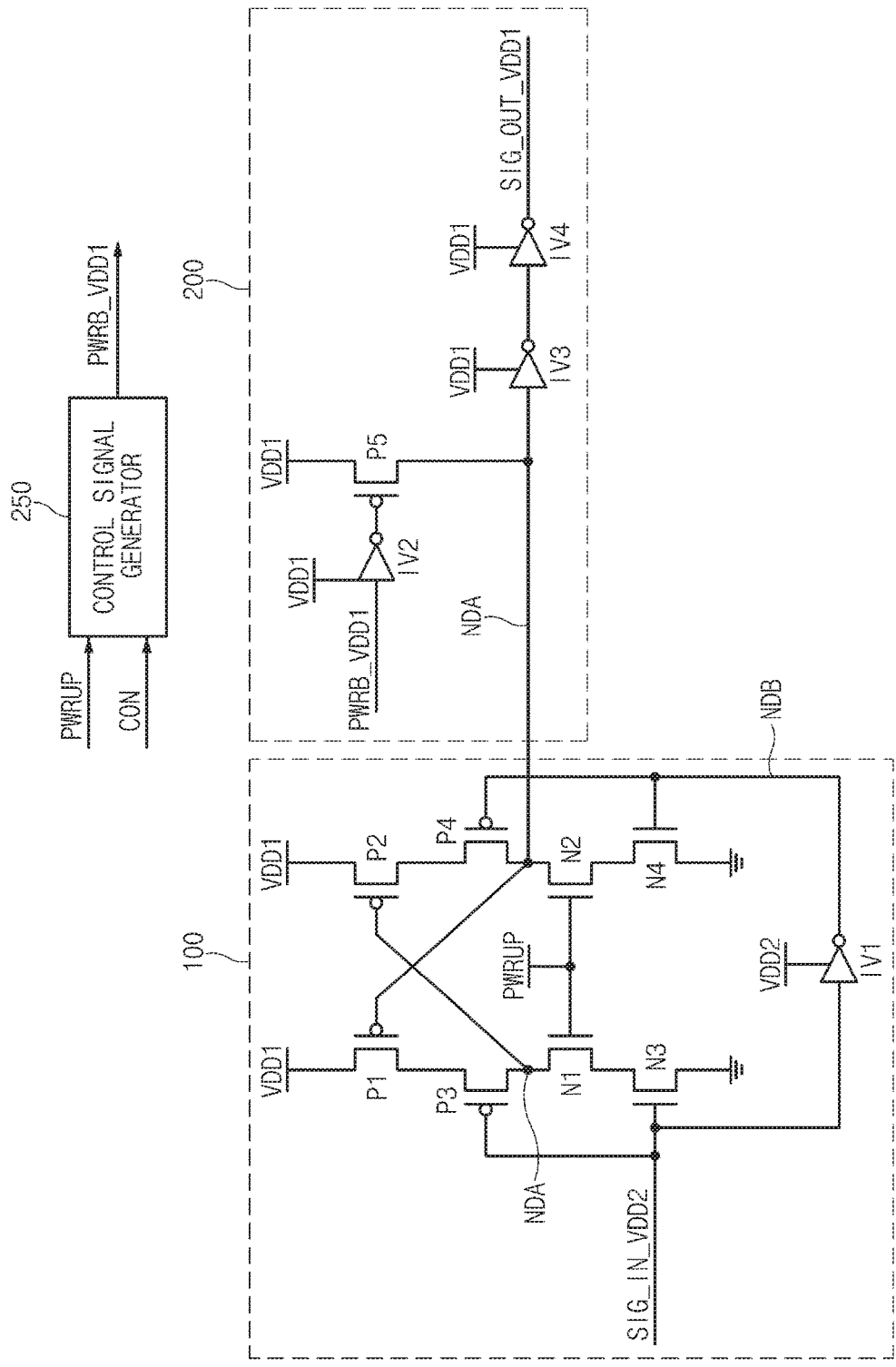
FIG. 1 is a circuit diagram illustrating a representation of an example of a power control device according to an embodiment of the present disclosure.

FIG. 1 is a circuit diagram illustrating a representation of an example of a power control device according to an embodiment of the present disclosure.

Referring to FIG. 1, the power control device may include an amplifier 100, an output portion 200, and a control signal generator 250. In an embodiment, a first power-supply voltage VDD1 and a second power-supply voltage VDD2 having different voltage levels may be used as drive voltages. For example, the first power-supply voltage VDD1 may be a power-supply signal supplied from a first power-supply voltage source, and the second power-supply voltage VDD2 may be a power-supply signal supplied from a second power-supply voltage source. The first power-supply voltage VDD1 may be higher in level than the second power-supply voltage VDD2.

The amplifier 100 may be implemented as a cross-coupled differential amplifier. The amplifier may include a plurality of PMOS transistors P1 to P4, a plurality of NMOS transistors N1 to N4, and an inverter IV1. The first power-supply voltage VDD1 acting as the operation voltage may be applied to source terminals of the PMOS transistors P1 and P2. The second power-supply voltage VDD2 acting as the operation voltage may be applied to the inverter IV1.

The PMOS transistors P1 and P3 and the NMOS transistors N1 and N3 may be coupled in series between a ground voltage terminal and a first power-supply voltage (VDD1) input terminal. The PMOS transistors P2 and P4 and the NMOS transistors N2 and N4 may be coupled in series between a ground voltage terminal and the first power-supply voltage (VDD1) input terminal.

The PMOS transistors P1 and P2 may be cross-coupled to each other. In an embodiment, a first pair of PMOS transistors P1 and P2 may be configured to receive the first power-supply voltage VDD1 through source terminals, and receive a signal at both ends of an output node (i.e., see NDA) through gate terminals. The PMOS transistor P3 and the NMOS transistor N3 may receive an input signal SIG_IN_VDD2 through a common gate terminal. The PMOS transistor P4 and the NMOS transistor N4 may receive an output signal of a node NDB through a common gate terminal. In an embodiment, a second pair of PMOS transistors P3 and P4 may be coupled between the first pair of PMOS transistors P1 and P2 and both ends of the output node (i.e., see NDA), and may be controlled by the input signal SIG_IN_VDD2. In an embodiment, a second pair of NMOS transistors N3 and N4 may be coupled between a ground voltage terminal and the first pair of NMOS transistors N1 and N2, and may be controlled by the input signal SIG_IN_VDD2.

For example, the inverter IV1 may be driven by the second power-supply voltage VDD2. The NMOS transistor N1 and the NMOS transistor N2 may receive a power-up signal PWRUP through a common gate terminal. In an embodiment, a first pair of NMOS transistors N1 and N2 may be coupled between both ends of the output node (i.e., see NDA), and may be controlled by the power-up signal PWRUP.

The output portion 200 may include a PMOS transistor P5 acting as a pull-up element and a plurality of inverters IV2 to IV4.

For example, the inverter IV2 may inversion-drive a control signal PWRB_VDD1. The PMOS transistor P5 may be coupled between the node NDA and the first power-supply voltage (VDD1) input terminal, and may receive an output signal of the inverter IV2 through a gate terminal. Here, a control signal PWRB_VDD1 may be generated by detecting the first power-supply voltage (VDD1) level.

The inverters IV3 and IV4 may perform non-inversion delaying of the output signal of the node NDA, and may output an output signal SIG_OUT_VDD1. The inverters IV3 and IV4 may be driven by the first power-supply voltage VDD1.

The control signal generator 250 may be controlled by a power-up signal PWRUP and a voltage control signal CON, and may thus output a control signal PWRB_VDD1.

The level shifter may be used in various digital circuits configured to increase a voltage level of a target signal up to a predetermined voltage level. The level shifter may generate an output voltage higher or lower than the voltage level received from the semiconductor memory device, and may be used as an interface between circuits having different levels.

A level-shifting speed, a static current, a drive current, etc. from among characteristics of the level shifter may be of importance. In the level shifter, the static current is a current flowing through a DC current path formed after completion of input-voltage amplification (i.e., after completion of level-shifting).

An above-mentioned level shifter will hereinafter be described with reference to the attached drawings.

If the power-up signal PWRUP is activated, the NMOS transistors N1 and N2 of the amplifier 100 may be turned on. That is, if the power-up signal PWRUP is activated during an initial power-up period, the amplification operation is carried out by the amplifier 100.

If a high-level input signal SIG_IN_VDD2 is input, the NMOS transistor N3 and the PMOS transistor P2 may be turned on. A logic low level may be applied to the PMOS transistor P4 by an inversion output signal of the inverter IV1, such that the PMOS transistor P4 may be turned on.

A high-level signal shifted to the first power-supply voltage (VDD1) level may be output to the output portion 200 through the output node NDA of the amplifier 100. If the output signal of the amplifier 100 is at a high level, the output signal SIG_OUT_VDD1 may be at a high level by the inverters IV3 and IV4.

In this case, during the ramp-up operation upon completion of the power-up operation, the first power-supply voltage (VDD1) level may not reach a stable logic high level. In this case, a leakage current occurs in the node NDA, such that a logic level of the output signal SIG_OUT_VDD1 may be unstably output.

Therefore, if a control signal PWRB_VDD1 is activated to a logic high level during the ramp-up operation, the PMOS transistor P5 may be turned on. As a result, the node NDA may be pulled up to the first power-supply voltage (VDD1) level, such that the output signal SIG_OUT_VDD1 may be stably output.

In contrast, if a logic low-level input signal SIG_IN_VDD2 is input to the amplifier 100, the PMOS transistor P3 contained in the amplifier 100 may be turned on. If a logic high-level signal is applied to the NMOS transistor N4 by an inversion output signal of the inverter IV1, the NMOS transistor N4 may be turned on.

Therefore, a low-level signal may be output to the output portion 200 through the output node NDA of the amplifier 100. If the output signal of the amplifier 100 is at a logic low level, the output signal SIG_OUT_VDD1 may be at a logic low level by the inverters IV3 and IV4.

Figure 2:
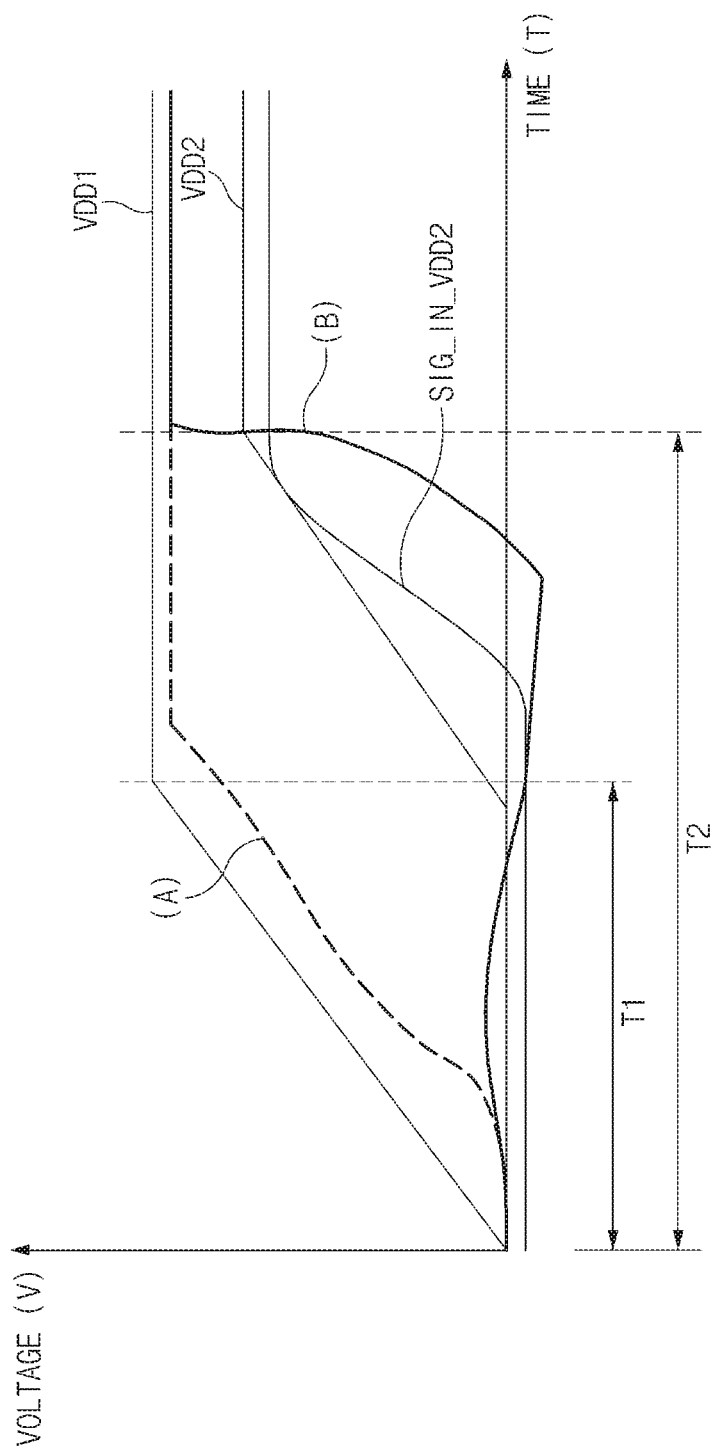
FIGS. 2 and 3 are waveform diagrams illustrating examples of the operations of the power control device illustrated in FIG. 1.
Figure 3:
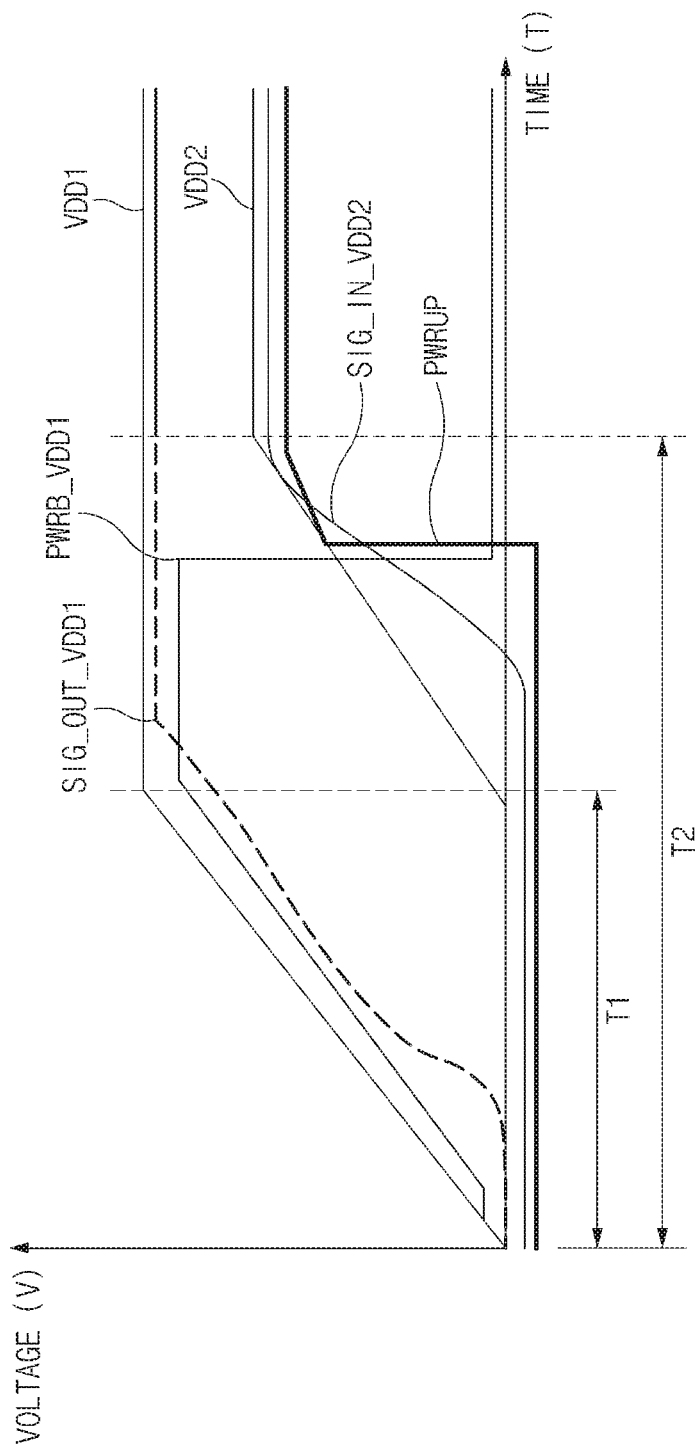

FIGS. 2 and 3 are waveform diagrams illustrating examples of the operations of the power control device illustrated in FIG. 1.

Referring to FIG. 2, during a specific time period T1 of the initial ramp-up operation, the first power-supply voltage VDD1 may gradually increase with a predetermined slope, may reach a target voltage level, and may be kept at a predetermined voltage level. After lapse of the time period T1, the second power-supply voltage VDD2 may gradually increase with a predetermined slope.

Thereafter, after the second power-supply voltage VDD2 reaches a target voltage level after lapse of a time period T2, the second power-supply voltage VDD2 may be kept at a predetermined voltage level. In other words, the second power-supply voltage VDD2 may be kept at zero volts (0V) during the time period T1 of the ramp-up operation of the first power-supply voltage VDD1. The input signal SIG_IN_VDD2 of the amplifier 100 may be floated and the output signal of the inverter IV1 may also be floated.

Therefore, the output signal of the amplifier 100 is floated so that the output voltage SIG_OUT_VDD1 having an unstable logic level may be output. In this case, the internal power-supply voltage may not be set to a target level.

That is, when the amplifier 100 normally operates, the output signal SIG_OUT_VDD1 may move to follow a waveform of the first power-supply voltage VDD1 as illustrated in FIG. 2(A). However, when the second power-supply voltage VDD2 is kept at zero volts (0V) during the time period T1, leakage current may occur in the output node NDA.

As a result, the output signal SIG_OUT_VDD1 may not increase to the first power-supply voltage (VDD1) level, and may abnormally transition to a logic high level after lapse of the time period T2 as illustrated in FIG. 2(B). Here, the time period T2 may denote a ramp-up period of the second power-supply voltage VDD2, and may be a predetermined time period to be consumed before the second power-supply voltage VDD2 reaches a stable logic high level.

In other words, it is assumed that the NMOS transistors N1 and N2 of the amplifier 100 may operate by the second power-supply voltage VDD2. The input signal SIG_IN_VDD1 may use the second power-supply voltage VDD2 as a power source. Therefore, the output signal SIG_OUT_VDD1 may be abnormally output before the beginning of the time period T2 prior to stabilization of the second power-supply voltage VDD2.

However, according to an embodiment of the present disclosure, the NMOS transistors N1 and N2 of the amplifier 100 may operate by the power-up signal PWRUP. In addition, the PMOS transistor P5 may be turned on by the control signal PWRB_VDD1, such that the output signal of the amplifier 100 may be pulled up. For example, an embodiment of the present disclosure may initialize the output signal of the amplifier 100 to a pull-up level during the initial power-up period.

Therefore, the first power-supply voltage VDD1 is applied to the output terminal of the amplifier 100 prior to the beginning of the time period T2 (before the second power-supply voltage (VDD2) level reaches the target level), such that the voltage level of the output signal SIG_OUT_VDD1 may increase. As a result, unnecessary leakage current does not occur in the output terminal of the amplifier 100, resulting in stabilization of the voltage level of the output signal SIG_OUT_VDD1.

For example, if the control signal PWRB_VDD1 is at a logic high level, the PMOS transistor P5 may remain off. In contrast, if the control signal PWRB_VDD1 is at a logic low level during the initial power-up operation, the PMOS transistor P5 is turned on, such that the output node NDA of the amplifier 100 may be pulled up to the first power-supply voltage (VDD1) level.

Accordingly, referring to FIG. 3, the PMOS transistor P5 may output a logic high-level signal having the first power-supply voltage (VDD1) level to the node NDA during a specific time in which the control signal PWRB_VDD1 is kept at a logic high level. Thus, the output signal SIG_OUT_VDD1 may gradually increase in response to the first power-supply voltage (VDD1) level, and may retain a logic high level.

In this case, the specific time in which the control signal PWRB_VDD1 is kept at a logic high level may continue to a time period in which the power-up signal PWRUP is kept at a logic low level. For example, if the power-up signal PWRUP transitions to a logic high level, the control signal PWRB_VDD1 may transition to a logic low level. In this case, the power-up signal PWRUP may be activated before the time period T2 in which the second power-supply voltage VDD2 is ramped up.

The control signal PWRB_VDD1 may be generated by detecting the first power-supply voltage (VDD1) level. For example, referring to FIG. 3, the control signal PWRB_VDD1 may gradually increase in response to the first power-supply voltage (VDD1) level prior to the ending of the time period T1. After lapse of the time period T1, the control signal PWRB_VDD1 may retain the same level or substantially the same level as the first power-supply voltage (VDD1) level. If the power-up signal PWRUP transitions to a logic high level before the end of the time period T2, the control signal PWRB_VDD1 may transition to a logic low level. In an embodiment, the control signal PWRB_VDD1 is changed based on the first power-supply voltage (VDD1) level, and transitions to a deactivation state during activation of the power-up signal PWRUP.

Figure 4:
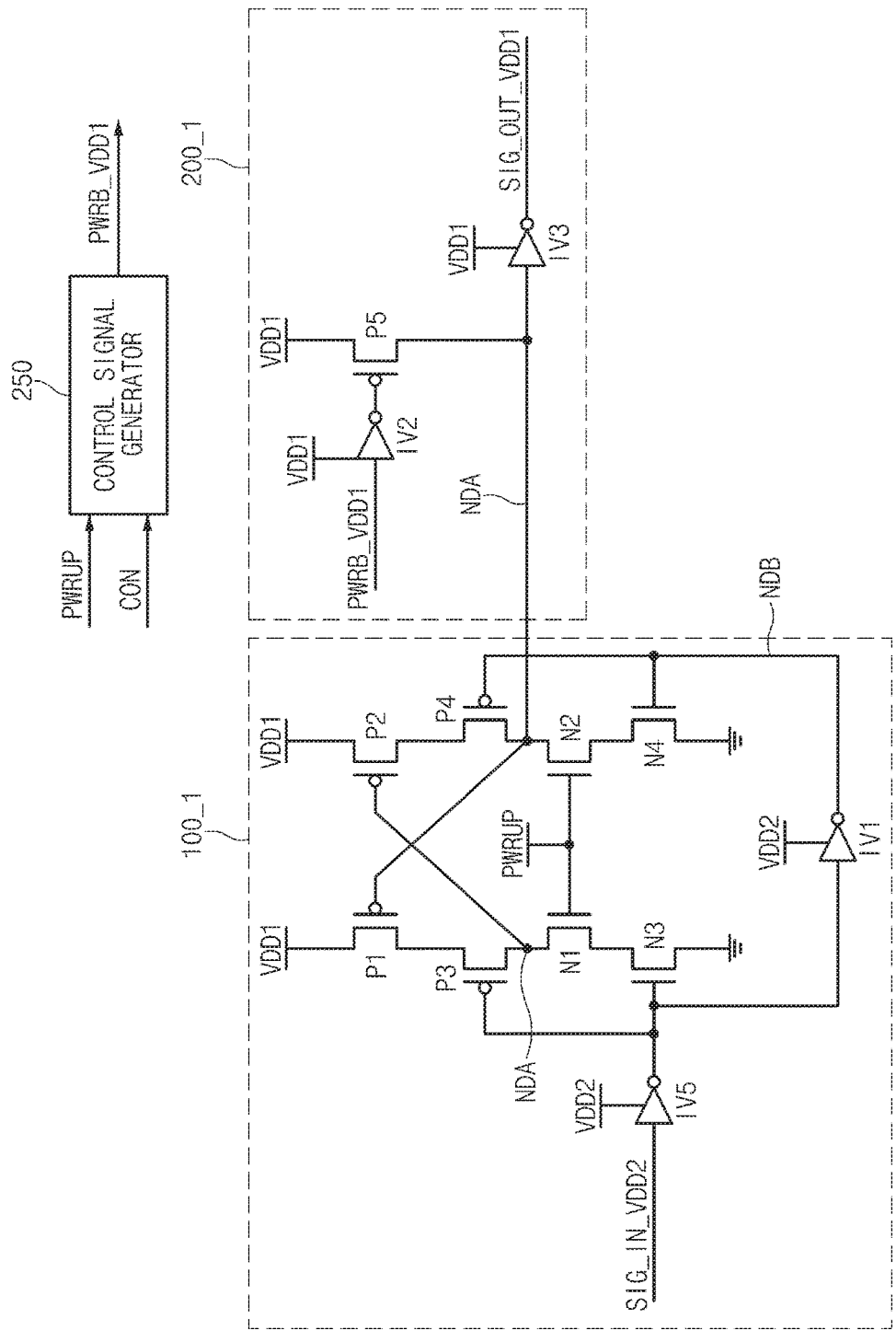
FIG. 4 is a circuit diagram illustrating a representation of an example of a power control device according to an embodiment of the present disclosure.

FIG. 4 is a circuit diagram illustrating a representation of an example of a power control device according to an embodiment of the present disclosure.

Referring to FIG. 4, the power control device may include an amplifier 100_1, an output portion 200_1, and a control signal generator 250. Detailed structures of the amplifier 100_1, the output portion 200_1, and the control signal generator 250 illustrated in FIG. 4 are identical to those of FIG. 1, a description thereof will herein be omitted, and only unique parts different from those of FIG. 1 will hereinafter be described with reference to the attached drawings.

The amplifier 100_1 may include an inverter IV5 configured to inversion-drive the input signal SIG_IN_VDD2. Here, the inverter IV5 may be driven by the second power-supply voltage VDD2.

Although the embodiments of FIG. 1 have, for example, disclosed that the output signal SIG_OUT_VDD1 is output through non-inversion driving of the output signal of the node NDA, the embodiments of FIG. 4 may invert the output signal of the node NDA using only one inverter IV3 and may output the output signal SIG_OUT_VDD1.

Figure 5:
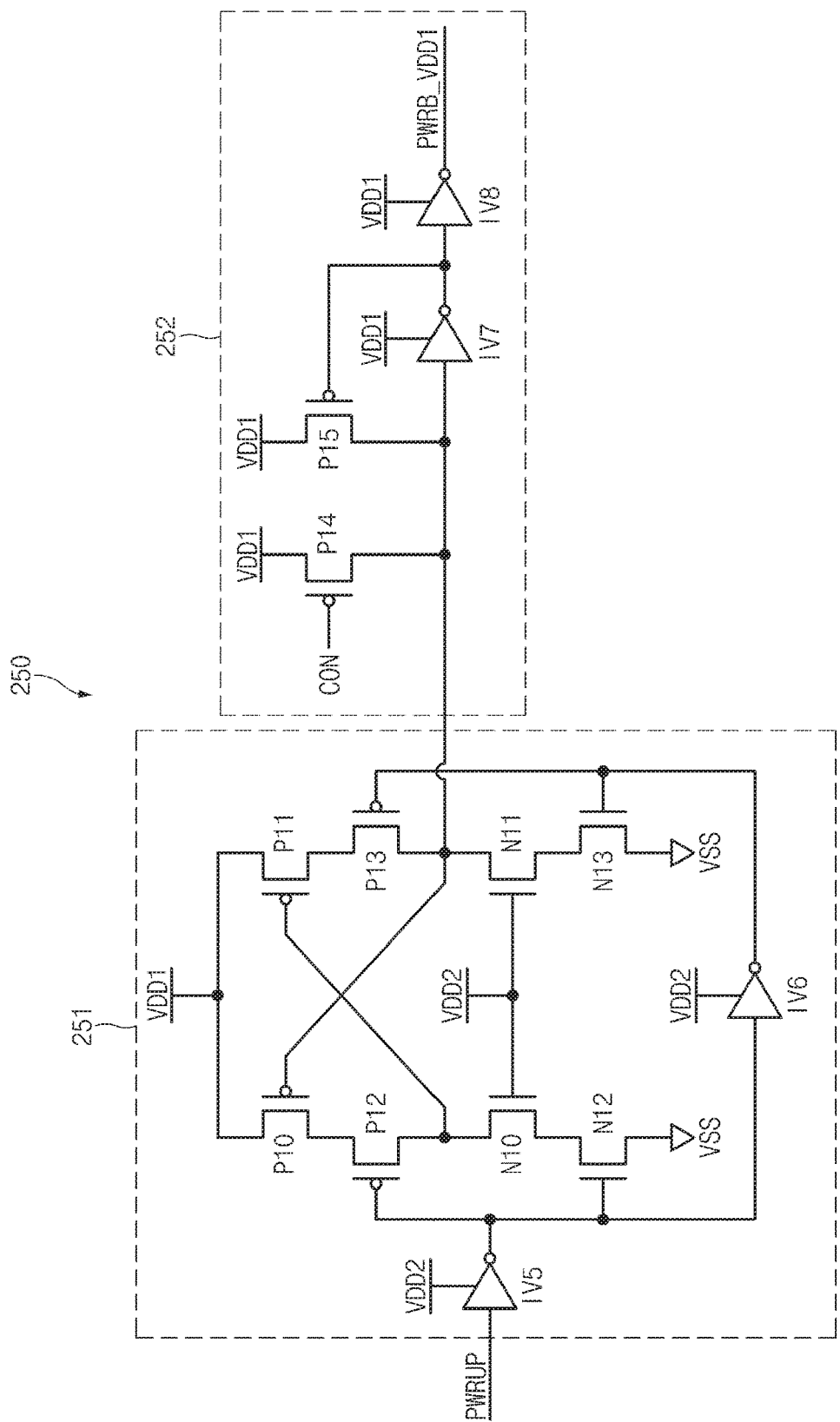
FIG. 5 is a circuit diagram illustrating a representation of an example of a control signal generator of the power control device according to an embodiment of the present disclosure.

FIG. 5 is a circuit diagram illustrating a representation of an example of the control signal generator 250 of the power control device according to an embodiment of the present disclosure.

Referring to FIG. 5, the control signal generator 250 may include a level change circuit 251 and a driver 252. The control signal generator 250 may use the first power-supply voltage VDD1 and the second power-supply voltage VDD2 having different voltage levels as the drive voltages.

The level change circuit 251 may be implemented as a cross-coupled differential amplifier. The level change circuit 251 may include a plurality of PMOS transistors P10 to P13, a plurality of NMOS transistors N10 to N13, and inverters IV5 and IV6. The first power-supply voltage VDD1 acting as the operation voltage may be applied to source terminals of the PMOS transistors P10 and P11. The second power-supply voltage VDD2 acting as the operation voltage may be applied to the inverters IV5 and IV6.

The PMOS transistors P10 and P12 and the NMOS transistors N10 and N12 may be coupled in series between a ground voltage terminal and the first power-supply voltage (VDD1) input terminal. The PMOS transistors P11 and P13 and the NMOS transistors N11 and N13 may be coupled in series between the ground voltage terminal and the first power-supply voltage (VDD1) input terminal.

The PMOS transistors P10 and P11 may be cross-coupled to each other. The PMOS transistor P12 and the NMOS transistor N12 may receive the power-up signal PWRUP inverted by the inverter IV5 through a common gate terminal. The PMOS transistor P13 and the NMOS transistor N13 may receive the output signal of the inverter IV6 through a common gate terminal.

For example, the inverter IV6 may be driven by the second power-supply voltage VDD2. The NMOS transistor N10 and the NMOS transistor N11 may receive the second power-supply voltage VDD2 through a common gate terminal.

The driver 252 may include PMOS transistors P14 and P15 acting as the pull-up elements and a plurality of inverters IV7 and IV8. The PMOS transistor P15 and the inverter IV7 may be used as a latch circuit configured to latch the output signal of the level change circuit 251.

The PMOS transistor P14 may be coupled between the first power-supply voltage (VDD1) input terminal and the output terminal of the level change circuit 251, such that the PMOS transistor P14 may receive a voltage control signal CON through a gate terminal. In this case, the voltage control signal CON may be generated by detecting the first power-supply voltage (VDD1) level.

The PMOS transistor P15 may be coupled between the first power-supply voltage (VDD1) input terminal and the output terminal of the level change circuit 251, such that the PMOS transistor P15 may receive the output signal of the inverter IV7 through a gate terminal. The inverters IV7 and IV8 may invert output signals of the drain terminals of the PMOS transistors P14 and P15, and may thus output the control signal PWRB_VDD1.

Figure 6:
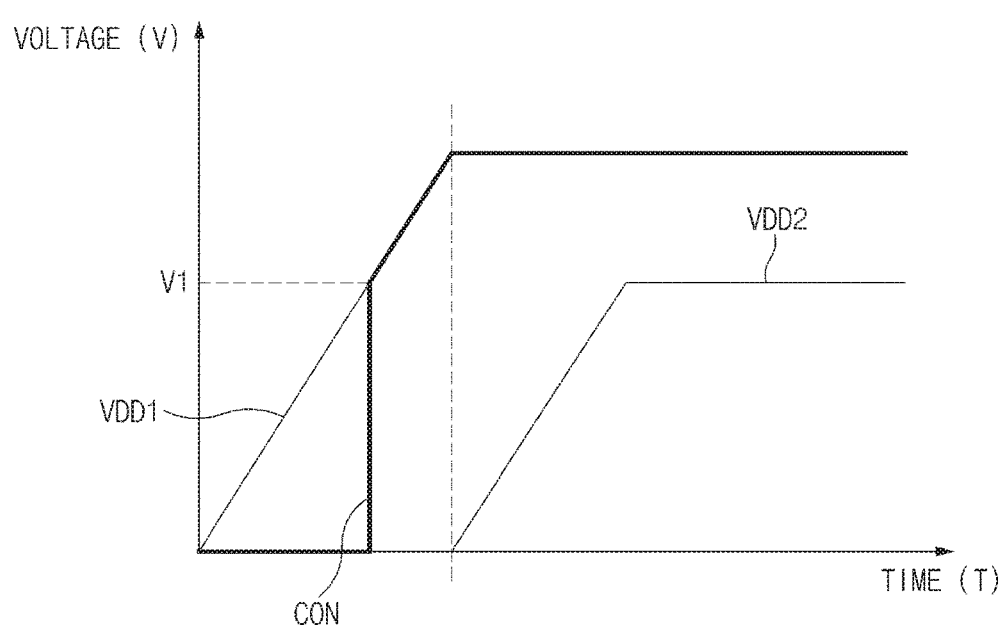
FIG. 6 is a waveform diagram illustrating examples of operations of the control signal generator illustrated in FIG. 5.

FIG. 6 is a waveform diagram illustrating examples of operations of the control signal generator 250 illustrated in FIG. 5.

Referring to FIG. 6, an embodiment of the present disclosure may pull up the output signal of the amplifier 200 according to the control signal PWRB_VDD1, and may latch the output signal of the amplifier 200. Therefore, since the output signal SIG_OUT_VDD1 is driven at a logic high level, the output signal SIG_OUT_VDD1 having a stable logic level may be output during the ramp-up period.

That is, if the voltage control signal CON is at a logic high level, the PMOS transistor P4 may remain off. In contrast, if the voltage control signal CON is at a logic low level during the initial power-up operation, the PMOS transistor P14 may be turned on such that the output terminal of the level change circuit 251 may be pulled up to the first power-supply voltage (VDD1) level.

Therefore, during a specific time in which the voltage control signal CON is at a logic low level, the PMOS transistor P14 may output a logic high-level signal having the first power-supply voltage (VDD1) level to the latch circuit (including the PMOS transistor N15 and the inverter IV7). Accordingly, the latch circuit may latch a logic high-level signal for a predetermined time, may initialize the control signal PWRB_VDD1 to a logic high level, and may output the resultant high-level control signal PWRB_VDD1, such that a path of a leakage current is cut off. In this case, the predetermined time in which the latch circuit latches the output signal of the PMOS transistor N14 may be maintained before a predetermined period in which the second power-supply voltage VDD2 is ramped up.

The voltage control signal CON may be generated by detecting the first power-supply voltage (VDD1) level. That is, referring to FIG. 6, if the first power-supply voltage (VDD1) level is less than a specific level (V1), the voltage control signal CON may be at a logic low level. On the other hand, if the first power-supply voltage (VDD1) level is equal to or higher than a specific voltage level (V1), the voltage control signal CON may be at a logic high level and may move to follow the first power-supply voltage (VDD1) level.

Figure 7:
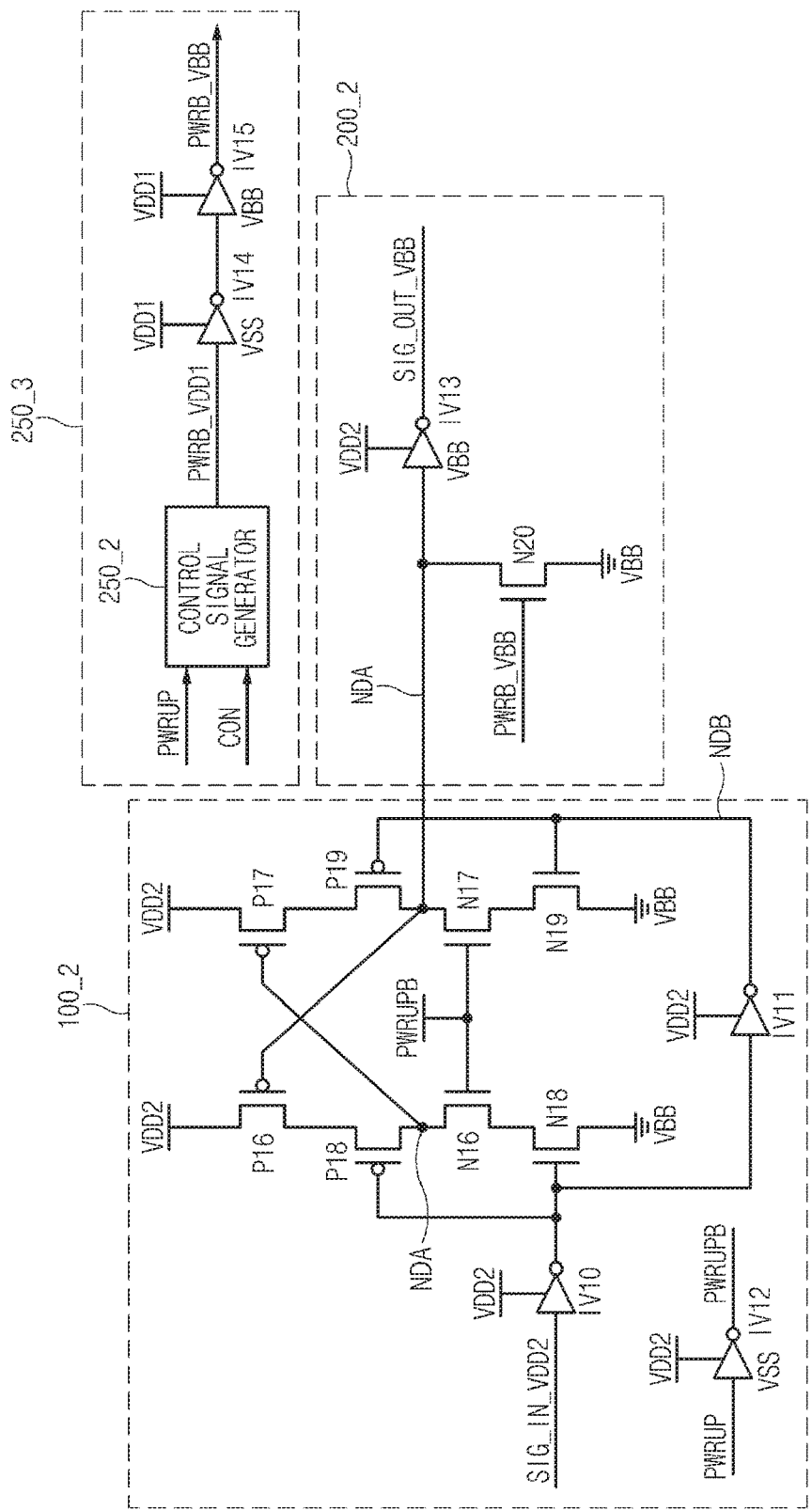
FIG. 7 is a circuit diagram illustrating a representation of an example of a power control device according to an embodiment of the present disclosure.

FIG. 7 is a circuit diagram illustrating a representation of an example of a power control device according to an embodiment of the present disclosure.

Referring to FIG. 7, the power control device may include an amplifier 100_2, an output portion 200_2, and a controller 250_3.

The amplifier 100_2 may be implemented as a cross-coupled differential amplifier. The amplifier 100_2 may include a plurality of PMOS transistors P16 to P19, a plurality of NMOS transistors N16 to N19, and inverters IV10 to IV12. The PMOS transistors P16 and P17 and the inverters IV10 to IV12 may receive the second power-supply voltage (VDD2) as the operation voltage.

The PMOS transistors P16 and P18 and the NMOS transistors N16 and N18 may be coupled in series between the second power-supply voltage (VDD2) input terminal and a back-bias voltage (VBB) input terminal. The PMOS transistors P17 and P19 and the NMOS transistors N17 and N19 may be coupled in series between the second power-supply voltage (VDD2) input terminal and the back-bias voltage (VBB) input terminal. In this case, the back-bias voltage VBB may have a negative voltage level lower than the ground voltage (VSS) level.

The PMOS transistors P16 and P17 may be cross-coupled to each other. In an embodiment, a first pair of PMOS transistors P16 and P17 may be configured to receive the second power-supply voltage VDD2 through source terminals, and receive a signal at both ends of an output node (i.e., see NDA) through gate terminals. The PMOS transistor P18 and the NMOS transistor N18 may receive the input signal SIG_IN_VDD2 inverted by the inverter IV10 through a common gate terminal. The PMOS transistor P19 and the NMOS transistor N19 may receive the output signal of the node NDB through a common gate terminal. In an embodiment, a second pair of PMOS transistors P18 and P19 may be coupled between the first pair of PMOS transistors P16 and P17 and both ends of the output node (i.e., see NDA), and may be controlled by an inversion signal of the input signal SIG_IN_VDD2. In an embodiment, a second pair of NMOS transistors N18 and N19 may be coupled between a back bias voltage terminal and the first pair of NMOS transistors N16 and N17, and may be controlled by an inversion signal of the input signal SIG_IN_VDD2.

The inverter IV12 may output a power-up bar signal PWRUPB by inverting the power-up signal PWRUP. Here, the power-up bar signal PWRUPB may be opposite in phase to the power-up signal PWRUP. The inverter IV12 may operate by the second power-supply voltage VDD2 and the ground voltage VSS. The NMOS transistor N16 and the NMOS transistor N17 may receive the power-up bar signal PWRUPB through a common gate terminal. In an embodiment, a first pair of NMOS transistors N16 and N17 may be coupled between both ends of the output node (i.e., see NDA), and may be controlled by an inversion signal of the power-up signal PWRUP or power-up bar signal PWRUPB.

The output portion 200_2 may include an NMOS transistor N20 acting as a pull-down element and an inverter IV13.

Here, the NMOS transistor N20 may be coupled between the node NDA and the back-bias voltage (VBB) input terminal, such that the NMOS transistor N20 may receive a control signal PWRB_VBB through a gate terminal. For example, the control signal PWRB_VBB may be generated by detecting the first power-supply voltage (VDD1) level.

The inverter IV13 may output an output signal SIG_OUT_VBB by inverting the output signal of the node NDA. Here, the inverter IV13 may be driven by the second power-supply voltage VDD2 and the back-bias voltage VBB.

The controller 250_3 may be controlled by the power-up signal PWRUP and the voltage control signal CON, and may thus output the control signal PWRB_VBB. The controller 250_3 may include a control signal generator 250_2 and inverters IV14 and IV15. A detailed structure and operations of the control signal generator 250_2 illustrated in FIG. 7 are identical to those of FIGS. 5 and 6, and as such a description thereof will herein be omitted for convenience of description.

The inverters IV14 and IV15 may perform non-inversion delaying of the control signal PWRB_VDD1, and may thus output the control signal PWRB_VBB. Here, the inverter IV14 may use the first power-supply voltage VDD1 and the ground voltage VSS as the drive voltages, and the inverter IV15 may use the first power-supply voltage VDD1 and the back-bias voltage VBB as the drive voltages.

Figure 8:
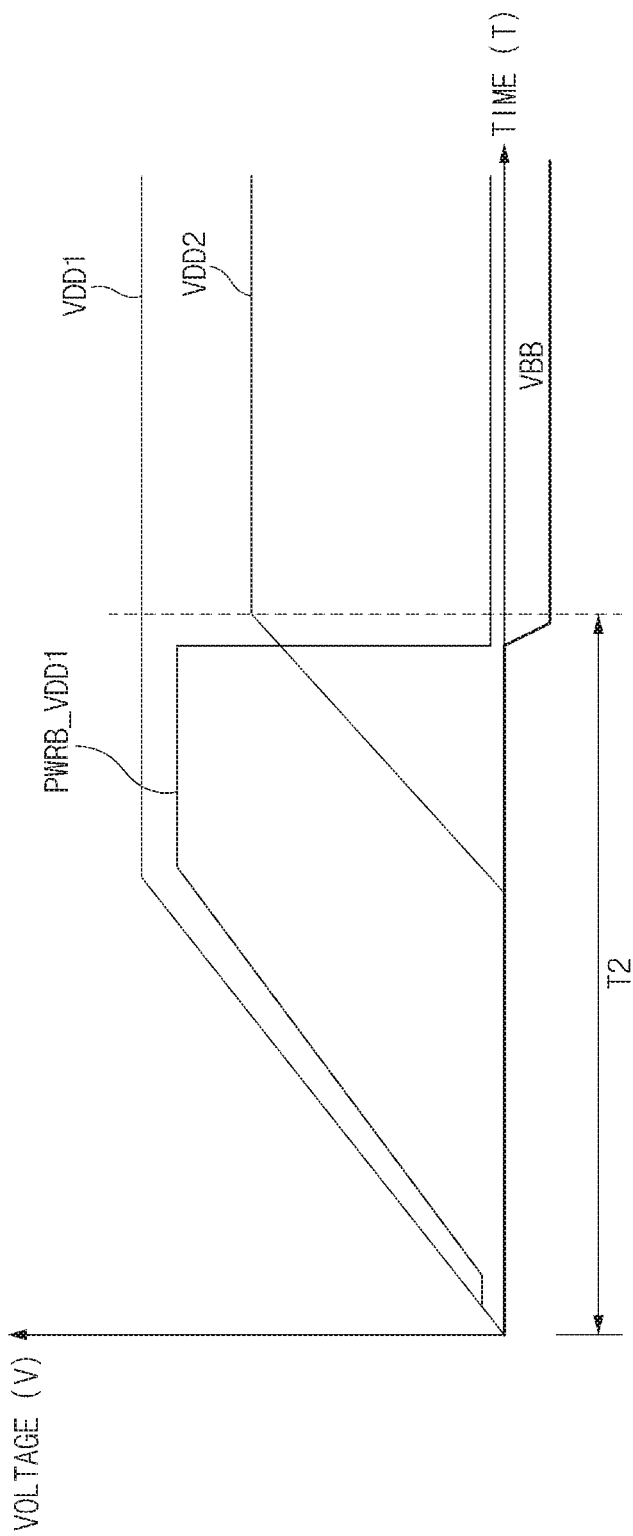
FIG. 8 is a waveform diagram illustrating examples of operations of a controller illustrated in FIG. 7.

FIG. 8 is a waveform diagram illustrating examples of operations of the controller 250_3 illustrated in FIG. 7.

Referring to FIG. 8, the back-bias voltage VBB may transition to a negative voltage level as soon as the control signal PWRB_VDD1 transitions to a logic low level when the back-bias voltage VBB retains the ground voltage (VSS) level.

That is, the back-bias voltage VBB may retain the ground voltage (VSS) level during the ramp-up period T2 of the second power-supply voltage VDD2, and may transition to a negative voltage level by synchronizing with a specific time at which the control signal PWRB_VDD1 transitions from a logic high level to a logic low level.

Figure 9:
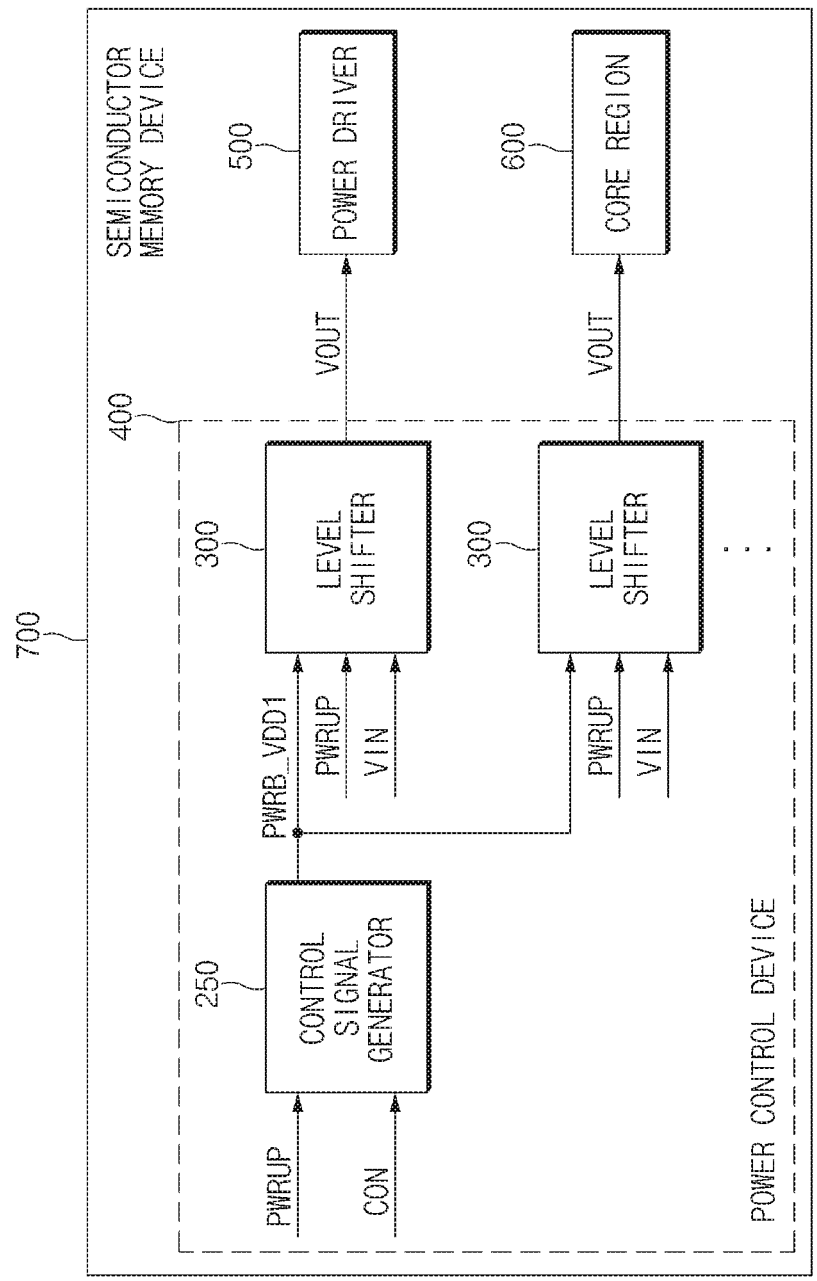
FIG. 9 is a block diagram illustrating a representation of an example of a semiconductor memory device including a power control device according to an embodiment of the present disclosure.

FIG. 9 is a block diagram illustrating a representation of an example of a semiconductor memory device including a power control device according to an embodiment of the present disclosure.

The semiconductor memory device 700 according to an embodiment may include a power control device 400, a power driver 500, and a core region 600. The power control device 400 may include a control signal generator 250 and a plurality of level shifters 300.

In an embodiment, the control signal generator 250 may generate a control signal PWRB_VDD1 for controlling the level shifter 300 based on the power-up signal PWRUP and the voltage control signal CON.

During the initial power-up operation, the level shifter 300 may perform level shifting of the power-supply voltage based on the power-up signal PWRUP and an input signal VIN, and may output a level-shifted output signal VOUT to the power driver 500 or the core region 600. For example, the level shifter 300 may perform level shifting of the second power-supply voltage VDD2, and may output an output signal VOUT shifted to the first power-supply voltage (VDD1) level.

The level shifters 300 illustrated in FIG. 9 may be implemented with any of the level shifters illustrated in FIGS. 1 to 8 as necessary. For example a level shifter 300 may include at least one of an amplifier (i.e., 100, 100_1, and 100_2) and an output portion (i.e., 200, 200_1, and 200_2) associated with FIGS. 1 to 8. A single control signal generator 250 may be shared by a plurality of level shifters 300, such that the plurality of level shifters 300 may be initialized during the initial power-up operation.

The power driver 500 may drive the voltage level of the output signal VOUT received from the level shifter 300, and may output the driven voltage to internal circuits. The output signal VOUT of the level shifter 300 may be used as a power-supply signal of the core region 600. For example, the output signal VOUT of the level shifter 300 may be used as a power-supply signal (including a boosted voltage VPP, a power-supply voltage VDD, or other voltage levels) of the core region 600.

As semiconductor devices have been rapidly developed to implement higher integration with higher speeds, the operation for correctly generating and efficiently distributing a level or category of the external power-supply voltage and a voltage needed for internal parts of the semiconductor devices is of importance to semiconductor technologies.

Furthermore, multiple external power-supply voltages have been widely used in a semiconductor memory device 700 such as a dynamic random access memory (DRAM) embedded in mobile electronic systems such as a laptop computer, a Portable Multimedia Player (PMP), etc.

That is, a high voltage needed for driving a word line or the like is generated using a first external power-supply voltage. DC power voltage of a peripheral circuit or a core circuit is generated using a second external power-supply voltage that is lower than the first external power-supply voltage. In this case, efficiency in power distribution and various advantages may be provided.

A semiconductor memory device 700 may include an internal power-supply voltage generator configured to generate an internal power-supply voltage needed to operate the device by reducing a relatively high-level voltage to a predetermined level. The semiconductor memory device 700 may also include a reference voltage generator configured to generate a reference voltage needed to operate the internal power-supply voltage generator or the like. The semiconductor memory device 700 may also include a boosting voltage (VPP) generator needed to apply the boosted voltage to a word line of a memory cell. In addition, the semiconductor memory device 700 may include a level shifter configured to shift a first voltage level to a second voltage level.

The semiconductor memory device 700 may receive multiple power-supply voltages, and may generate a voltage needed for internal components of the device. An undesirable output voltage level may be generated by a difference in power-up speed between multiple power-supply voltages, and a solution to the undesirable output voltage level is needed. When the output voltage level is stably controlled, reliability of the power control device may be guaranteed so that power distribution can be more efficiently performed.

As is apparent from the above description, the embodiments of the present disclosure may stabilize output power when power of the power control device is ramped up, resulting in prevention of chip malfunction and a boot failure.

Figure 10:
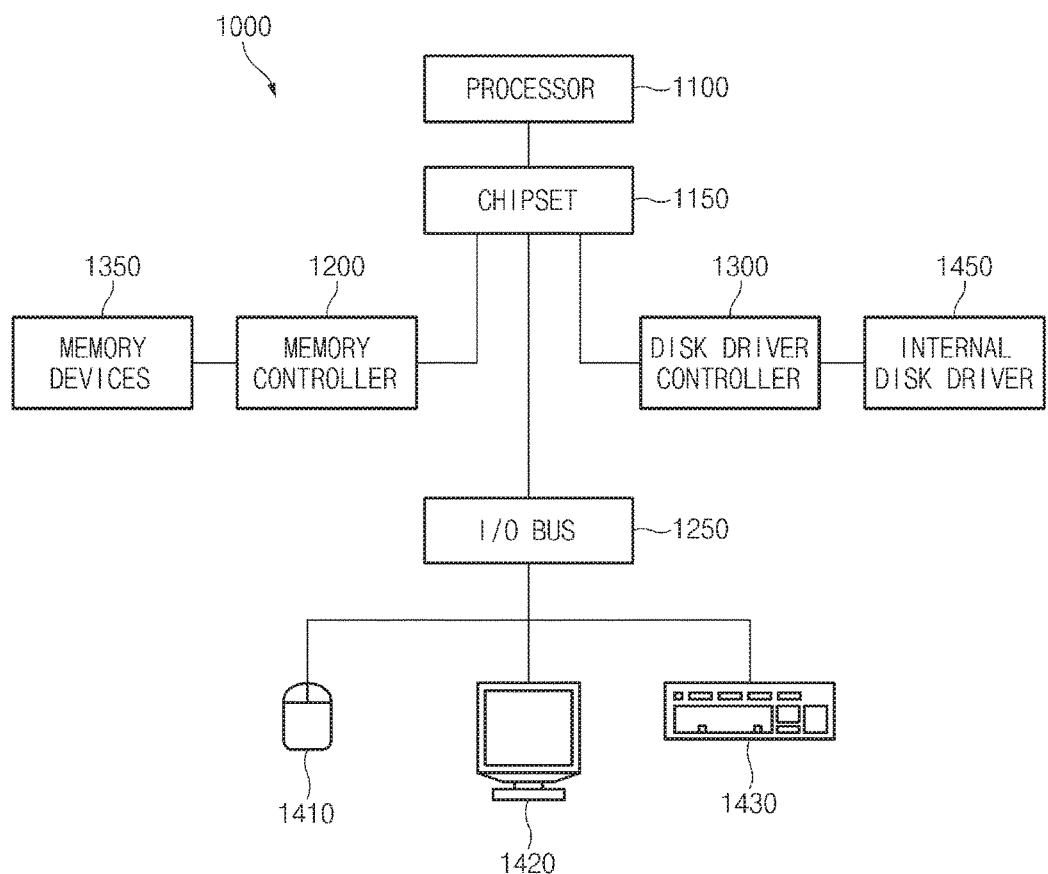
FIG. 10 illustrates a block diagram of an example of a representation of a system employing a power control device and or semiconductor memory device with the various embodiments discussed above with relation to FIGS. 1-9.

The power control devices and or semiconductor memory devices as discussed above (see FIGS. 1-9) are particular useful in the design of other memory devices, processors, and computer systems. For example, referring to FIG. 10, a block diagram of a system employing a power control device and or semiconductor memory device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one power control device and or semiconductor memory device as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one power control device and or semiconductor memory device as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 10 is merely one example of a power control device and or semiconductor memory device as discussed above with relation to FIGS. 1-9. In alternate embodiments, such as, for example but not limited to, cellular phones or digital cameras, the components may differ from the embodiments illustrated in FIG. 10.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosure or included as a new claim by a subsequent amendment after the application is filed.

Although a number of illustrative embodiments consistent with the description have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A power control device comprising:
    an amplifier configured to amplify an input signal having a second power-supply voltage level to a first power-supply voltage level having a voltage level different from the second power-supply voltage level, and perform an amplification operation when a power-up signal is activated during an initial power-up period;
    an output portion configured to set an output signal of the amplifier to a specific logic level before the power-up signal is activated during the initial power-up period upon receiving a control signal, and output the output signal having the specific logic level; and
    a control signal generator configured to generate the control signal based on the power-up signal and a voltage control signal.

2. The power control device according to claim 1, wherein the first power-supply voltage has a higher level than the second power-supply voltage.

3. The power control device according to claim 1, wherein the first power-supply voltage has a lower level than the second power-supply voltage.

4. The power control device according to claim 1, wherein:
    after the first power-supply voltage is ramped up during the initial power-up period, the second power-supply voltage is ramped up.

5. The power control device according to claim 1, wherein the amplifier includes:
    a first pair of PMOS transistors configured to receive the first power-supply voltage through source terminals, and receive a signal at both ends of an output node through gate terminals;
    a second pair of PMOS transistors coupled between the first pair of PMOS transistors and both ends of the output node, and controlled by the input signal;
    a first pair of NMOS transistors coupled between both ends of the output node, and controlled by the power-up signal; and
    a second pair of NMOS transistors coupled between a ground voltage terminal and the first pair of NMOS transistors, and controlled by the input signal.

6. The power control device according to claim 1, wherein the amplifier includes:
    a first pair of PMOS transistors configured to receive the first power-supply voltage through source terminals, and receive a signal at both ends of an output node through gate terminals;

a second pair of PMOS transistors coupled between the first pair of PMOS transistors and both ends of the output node, and controlled by an inversion signal of the input signal;

a first pair of NMOS transistors coupled between both ends of the output node, and controlled by the power-up signal; and a second pair of NMOS transistors coupled between a input terminal of a back-bias voltage and the first pair of NMOS transistors, and controlled by an inversion signal of the input signal.

7. The power control device according to claim 6, wherein the back-bias voltage is configured to transition to a negative voltage level when a ground voltage level is maintained and the control signal transitions to a logic low level in the initial power-up period.

8. The power control device according to claim 1, wherein the control signal is changed based on the first power-supply voltage level, and transitions to a deactivation state during activation of the power-up signal.

9. The power control device according to claim 1, wherein the output portion is configured to pull up an output terminal of the amplifier to the first power-supply voltage level before the power-up signal is activated.

10. The power control device according to claim 1, wherein the output portion includes:
a first pull-up element coupled between an input terminal of the first power-supply voltage and an output terminal of the amplifier, and configured to pull up the output terminal of the amplifier based on an inversion signal of the control signal; and
a one or more inverters configured to drive an output signal of the first pull-up element.

11. The power control device according to claim 1, wherein the output portion is configured to pull down an output terminal of the amplifier to a back-bias voltage level before the power-up signal is activated.

12. The power control device according to claim 1, wherein the output portion includes:
a first pull-down element coupled between a input terminal of a back-bias voltage and an output terminal of the amplifier, and configured to pull down the output terminal of the amplifier based on a signal obtained by delaying the control signal; and
an inverter configured to drive an output signal of the first pull-down element,
wherein the inverter is driven by the second power-supply voltage and the back-bias voltage.

13. The power control device according to claim 1, wherein the power-up signal is activated during a ramp-up period of the second power-supply voltage.

14. The power control device according to claim 1, further comprising:
a first inverter configured to delay the control signal, and the first inverter configured to be driven by the first power-supply voltage level and a ground voltage level; and
a second inverter configured to delay an output signal of the first inverter, and the second inverter configured to be driven by the first power-supply voltage level and a back-bias voltage level.

15. The power control device according to claim 1, wherein the control signal generator includes:
a level change circuit configured to shift the power-up signal to the first power-supply voltage level, and output the shifted power-up signal having the first power-supply voltage level; and
a driver configured to set an output signal of the level change circuit to a specific logic level before the power-up signal is activated upon receiving the voltage control signal, and output the output signal having the specific logic level.

16. The power control device according to claim 15, wherein:
if the first power-supply voltage is less than a specific level, the voltage control signal is at a logic low level; and
if the first power-supply voltage is equal to or higher than a specific level, the voltage control signal is changed based on the first power-supply voltage level.

17. A semiconductor memory device comprising:
a power control device configured to amplify an input signal having a second power-supply voltage level to a first power-supply voltage level having a voltage level different from the second power-supply voltage level, set an output signal to a specific logic level before a power-up signal is activated during a first time period upon receiving a control signal, and output the output signal having the specific logic level; and
a power driver configured to drive an output signal of the power control device, and provide a power-supply signal to internal circuits,
wherein the power control device includes:
a control signal generator configured to generate the control signal based on the power-up signal and a voltage control signal; and
a level shifter configured to set the output signal to the first power-supply voltage level before the power-up signal is activated upon receiving the control signal, and output the output signal having the first power-supply voltage level.

18. The semiconductor memory device according to claim 17, wherein the control signal generator is shared by a plurality of level shifters.

19. A power control device comprising:
an amplifier configured to amplify an input signal having a second power-supply voltage level to a first power-supply voltage level having a voltage level different from the second power-supply voltage level, and perform an amplification operation when a power-up signal is activated during a first time period;
an output portion configured to set an output signal of the amplifier to a specific logic level before the power-up signal is activated during the first time period upon receiving a control signal, and output the output signal having the specific logic level; and
a control signal generator configured to generate the control signal based on the power-up signal and a voltage control signal.

20. The power control device according to claim 19, wherein the control signal generator includes:
a level change circuit configured to shift the power-up signal to the first power-supply voltage level, and output the shifted power-up signal having the first power-supply voltage level; and
a driver configured to set an output signal of the level change circuit to a specific logic level before the power-up signal is activated upon receiving the voltage control signal, and output the output signal having the specific logic level.

* * * * *